(12) United States Patent
Stecher et al.

(10) Patent No.: US 7,960,239 B2
(45) Date of Patent: Jun. 14, 2011

(54) POWER DEVICE

(75) Inventors: Matthias Stecher, Munich (DE); Tobias Smorodin, Puchheim (DE)

(73) Assignee: Infineon Technologies AG, Neubiberg (DE)

( * ) Notice: Subject to any disclaimer, the term of this patent is extended or adjusted under 35 U.S.C. 154(b) by 637 days.

(21) Appl. No.: 11/870,739

(22) Filed: Oct. 11, 2007

(65) Prior Publication Data

US 2009/0114984 A1   May 7, 2009

(51) Int. Cl.
*H01L 29/66* (2006.01)
(52) U.S. Cl. .................. 438/306; 257/337; 257/E29.256
(58) Field of Classification Search .................. 438/306; 257/337, E29.256
See application file for complete search history.

(56) References Cited

U.S. PATENT DOCUMENTS

| 2002/0030224 A1* | 3/2002 | Hshieh et al. | 257/329 |
| 2002/0140027 A1* | 10/2002 | Mo et al. | 257/330 |
| 2004/0084761 A1* | 5/2004 | Karthikeyan et al. | 257/700 |

OTHER PUBLICATIONS

T. Smorodin et al., "Investigation and Improvement of Fast Temperature-Cycle Reliability for DMOS-Related Conductor Path Design", Physics Symposium 2007, Proceedings, 45th Annual IEEE Inter., Apr. 15-19, 2007.
T. Smorodin et al., "Power-Cycling of DMOS-Switches Triggers Thermo-Mechanical Failure Mechanisms", 2007.
J. Busch et al., "Key Features of a Smart Power Technology for Automotive Applications", Infineon Technologies AG, Munich & Regensburg, Germany, 2002.

* cited by examiner

*Primary Examiner* — Steven J Fulk
(74) *Attorney, Agent, or Firm* — Dicke, Billig & Czaja, PLLC (57) ABSTRACT

A power device with improved reliability and a method for producing the same is disclosed. One embodiment provides an active area having an electrical power dissipation characteristic, a metallization layer portion configured with respect to the active area so that the dissipation characteristic of the active area results in heating the metallization layer portion, the metallization layer portion being formed as a connected region. The metallization layer portion has at least one hole, fully extending through the metal layer and having a dielectric. The at least one hole is arranged so that each location of the metal layer portion is connected electrically to each other location via the metallization material of the metal layer portion.

18 Claims, 10 Drawing Sheets

Top view

Forming an active area of a power device with an electrical power dissipation characteristic —80

Forming a metallization layer portion arranged with respect to the active area so that the dissipation characteristic of the active area results in heating the metallization layer portion, wherein the metallization layer portion having at least one hole fully extended through the metal layer and having dielectric, wherein the at least one hole is arranged so that each location of the metallization layer portion is electrically connected to each other location via the metallization material of the metallization layer portion —82

FIG 12

POWER DEVICE

BACKGROUND

Embodiments of the invention relate to a power device with an improved thermo-mechanical reliability and a method for producing the power device and a mask for a metallization for a power device.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

With reference to the accompanying FIGS. 1-12, explanations and embodiments relating to a power device with an improved reliability and to a method for producing the same and manufacturing a mask for a metallization layer for a power device are described.

During operation of a power device, for example, a double-diffused metal-oxide-semiconductor (DMOS) transistor can be objected cyclically to severe temperature changes. In the following this cyclical temperature changes are also termed repetitive clamping. Depending on the power device those severe temperature changes may be termed differently, for example, power cycling for insulated-gate bipolar transistors (IGBT) or active cycling for single transistors. More general the power device may undergo short and severe temperature changes or power cycle stress, which can be the result of short electrical pulses, e.g., introduced by a inductive current in the power device. The resulting thermo-mechanical stress can cause a viscoplastic or plastic deformation of the metallization of the power device. At a certain yield point or yield strength the metallization layer begins to plastically deform. Prior to the yield point the metal layer will deform elastically and will return to its original shape when the applied stress is removed. Above a certain yield point the deformation of the metallization is irreversible. During a plastic deformation of a metallization layer the mechanical stress in the metallization layer increases only marginally, but a severe change of the strain can be observed. Because of the viscoplastic deformation of the metal layer, the local stress, for example, on an inter layer dielectric (ILD) layer of the power device increases and beyond a critical limit, the ILD may crack. An electric short circuit caused by extruding metal may be the consequence and because of that, a breakdown of the power device. The viscoplastic deformation of the metal layer is not initiated in the center of the power device, which may include the maximum temperature, but rather at a region having the maximum temperature gradient. The viscoplastic deformation is propagating from this region to the center of the power device depending on the exact layout of the metallization layer. That means, the location of the maximum temperature gradient is the starting point of the viscoplastic deformations of the metal layer. It should be noted that the terms metallization, metal layer or metallization layer are interchangeably used within this description.

Figure 1:
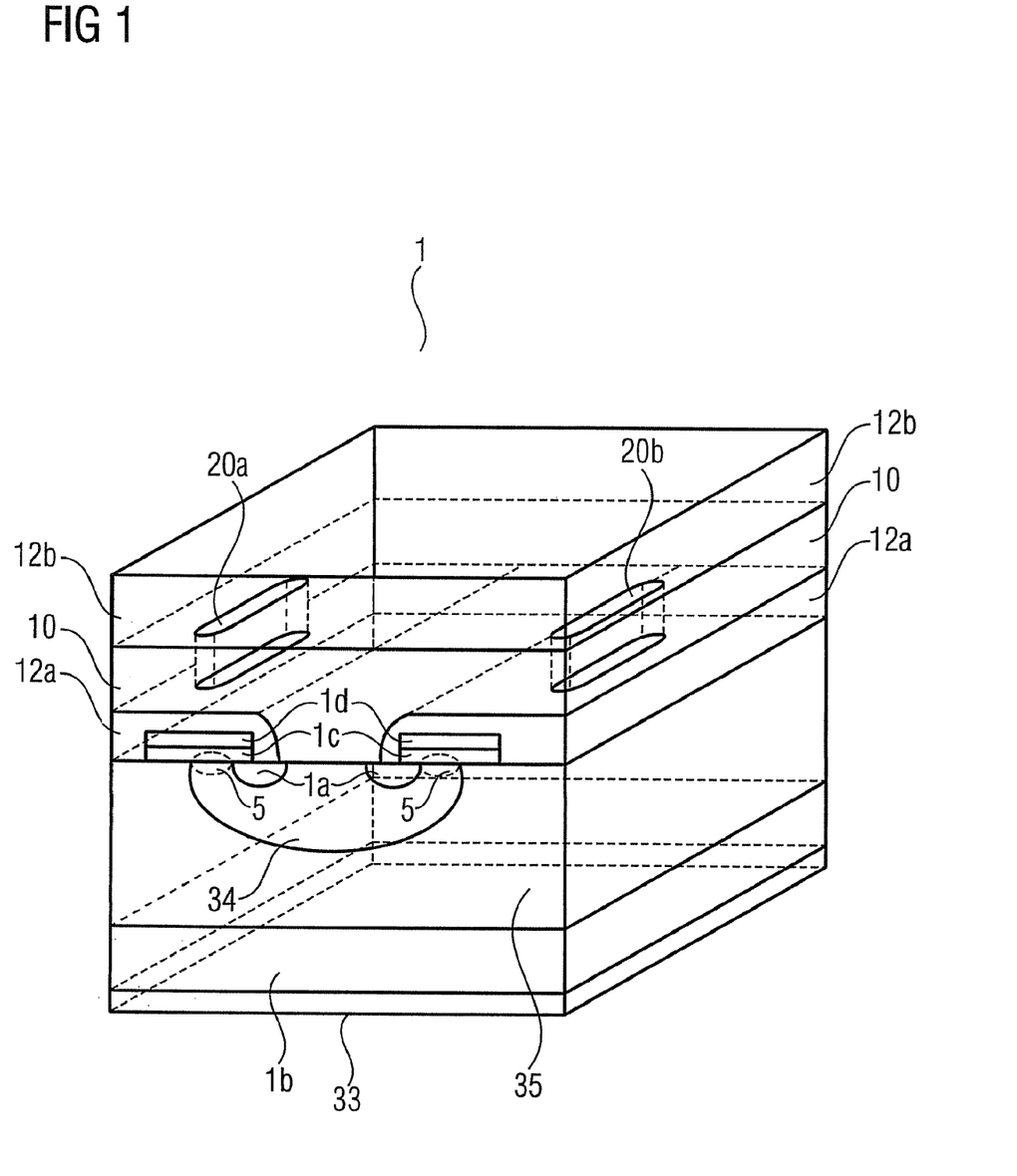
FIG. 1 illustrates a schematic drawing of a power device according to one embodiment.
Figure 2:
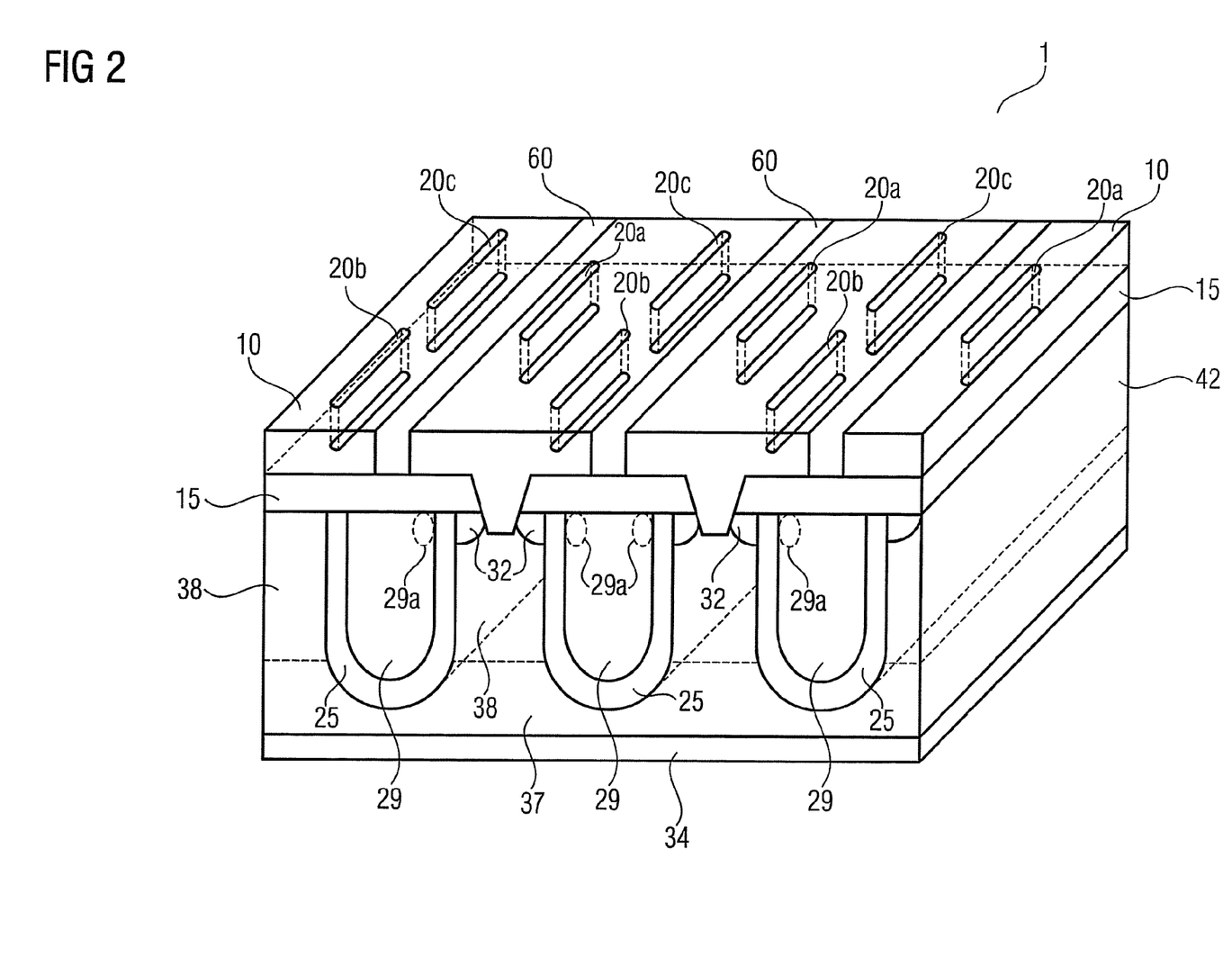
FIG. 2 illustrates a drawing of a double-diffused metal-oxide-semiconductor (DMOS) transistor according to another embodiment.

In FIG. 1, a power device with an improved reliability is illustrated. The power device 1 can be, for example, as illustrated, an n-channel power MOSFET with a source region 1a (n$^+$-doped), a drain region 1b (p-substrate), a gate dielectric 1c and a gate electrode 1d, which is isolated against a metallization layer 10 by a dielectric layer 12a. An active area 5 may be formed in this case by the channel of the field effect transistor in a p$^+$-doped well 34 with the respective n$^+$-doped source region 1*a*. The MOSFET may be realized in a n-epi-taxial layer 35. The drain region 1*b* my be in contact to a metal layer 33.

The power device 1 includes an active area 5 having an electrical power dissipation characteristic. Furthermore a metallization layer portion 10, so with respect to the active area 5 that the dissipation characteristic of the active area 5 results in heating the metallization layer portion 10. The metallization layer portion being formed as a connected region, wherein the metallization layer portion 10 includes at least one hole 20*a*, fully extending through the metal layer 10 and having dielectric, wherein the at least one hole 20*a* is arranged so that each location of the metallization layer portion 10 is connected electrically to each other location via the metallization material of the metallization layer portion.

In FIG. 1 the metal layer 10 includes two holes 20*a*, 20*b* and moreover exemplarily another dielectric layer 12*b* on top of the metal layer 10. During a repetitive clamping or more general, during short and severe temperature changes or a power cycle stress of the power device, the holes 20*a*, 20*b* in the metal layer 10, filled with a dielectric material may act as mechanical supporting structures for the superjacent dielectric layer 12*b* and the metal layer 10. That means even if the metal layer will deform plastically because of the thermo-mechanical stress introduced by the repetitive clamping, the local stress on the dielectric layer 12*b* and 12*a* is reduced by the holes 20*a*, 20*b*, which act as supporting structures. Moreover the area of the metal layer 10 is reduced by the holes 20*a* and 20*b*. That means the connected metal layer regions—for example the region between the holes 20*a* and 20*b*—are smaller compared to a metal layer without the holes. But for a small-sized structured metal layer, for example made of copper or aluminum, the mechanical yield stress, the yield point respectively is increased compared to a large-area metal layer. The plastic deformation of the smaller structured metal layer portions occurs first at higher thermo-mechanical stress.

Because of the structuring of the metal layer in smaller connected portions with the holes and the mechanical supporting functionality of the holes the power device exhibit a better temperature cycling reliability compared to a power device without the supporting structures.

The power device may be a lateral DMOS or a vertical DMOS, a trench DMOS (TDMOS), for example. The TDMOS transistor (FIG. 2) may include a plurality of trenches 25 in a substrate 42 lined with a field oxide, silicon oxide, for example. The trenches 25 may be filled with polysilicon 29, wherein the polysilicon is forming a gate electrode 29*a*. Adjacent to the gate electrode 29*a* the field oxide 25 forms a gate oxide isolating the gate electrode against a source region 32, a channel region 35 and a drain region, for example, formed by a n-epi layer 37, which may be in contact to a metal layer 34 forming the drain contact. The source region 32 may be n$^+$-doped implanted into a p-doped mesa-region 38 between two trenches 25. The substrate 40, with the trench structures 25 and the respective polysilicon 29 may be covered by an inter-level dielectric or intermetal dielectric 15. The inter-level dielectric material may include oxide, nitride, organic materials, boron silicate glass (BSG), phosphorus silicate glass (PSG), boron phosphorus silicate glass (PBSG) or other dielectric materials. The source region 32, as well as the mesa region 38, are connected via a contact 30 made, for example, of the p$^+$-doped material or a metal, through the intermetal dielectric layer 15 with respective metal layer portions 10. That means the metallization layer portions 10 can act as a contact to the source region 32 of a power TDMOS formed by the gate electrodes 29*a*, the gate oxide 25, the source region 32, the channel region 35 and the drain contact 37. Each mesa region 38 may include a contact to a respective metallization layer portion 10 forming the source contact. The metallization layer portion 10 may be separated from each other by a dielectric material 60. Each of the metallization layer portions 10 may include oblong holes 20*a*-20*c*, fully extending through the metallization layer portion 10, wherein the oblong holes may be filled with a dielectric material. The oblong holes 20*a*-20*c* may be parallel oriented to the longer side L 10' compared to the briefer side W 10" of the source contact, formed by the metallization layer portion 10. In TDMOS transistors with a conventional metallization a viscoplastic deformation of the metallization layer caused by a repetitive clamping stress could increase the local pressure on the intermetal dielectric 15. At a critical point, the intermetal dielectric can break, which can lead to a short circuit and a breakdown of the TDMOS transistor.

By introducing the holes 20*a*-20*c* in the metallization layer portion 10 the breakdown caused by the repetitive clamping stress can be avoided or at least delayed. The supporting structures 20*a*-20*c*, which can be filled with a dielectric, may act as a mechanical support for the metallization layer portions 10, the intermetal dielectric or other dielectric or metal layers deposited on top of the metallization layer portions 10. For simplicity, those additional layers on top of the metallization layer portions 10 are not illustrated in the FIG. 2. The oblong holes 20*a*-20*c* may be filled with oxide, which can be deposited by using chemical vapor deposition (CVD), for example. The dielectric, which is used to fill the oblong holes may include a less viscoplastic deformation than the metallization layer portion 10 upon heating, the repetitive clamping stress, respectively. The metallization layer portion 10 may be, for example, made of aluminum or copper and the oblong holes 20*a*-20*c* may be filled with an oxide.

The supporting structures may be connected electrically to each other location via the metallization material of the metallization layer portion.

As mentioned above a viscoplastic deformation of a metallization layer may be initiated at the region of the maximum temperature gradient. This viscoplastic deformation can be suppressed by introducing at least one hole, fully extending through the metallization layer. In the following, exemplarily design rules for the at least one hole, fully extending through the metallization layer and having dielectric, is referring to metallization layer levels of a power amplifier, a power DMOS, for example. The metallization layer may be made of aluminum and, therefore, may be particular vulnerable to a viscoplastic deformation of the metallization.

Figure 3:
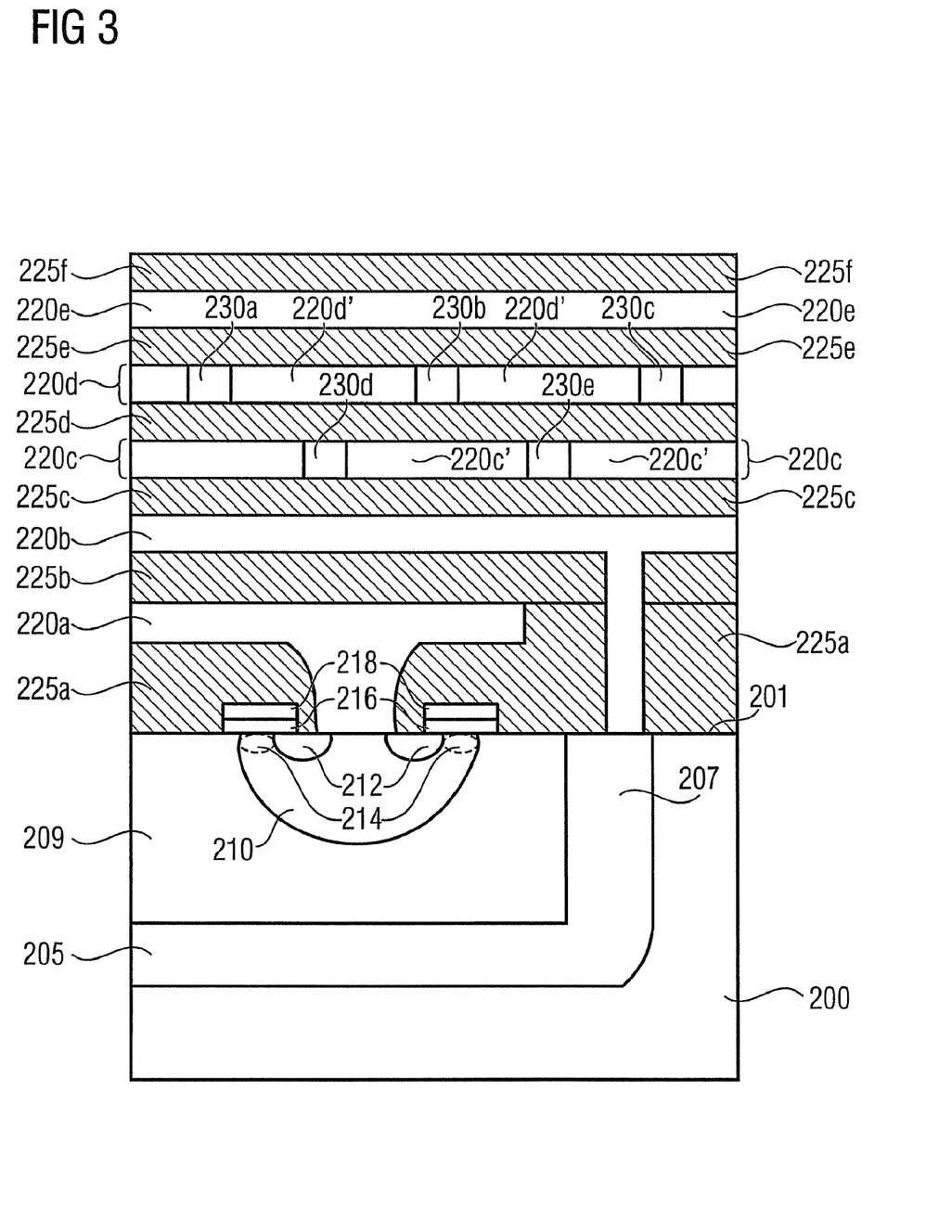
FIG. 3 illustrates a schematic cross section of a quasi vertical double-diffused metal-oxide-semiconductor (QVDMOS) transistor with several metallization layers according to another embodiment.

As a further embodiment FIG. 3 illustrates a schematic cross section of a quasi vertical double-diffused metal-oxide-semiconductor (QVDMOS) transistor with several metallization layers including partially the supporting structures. The QVDMOS does not use a backside drain contact, as it is illustrated for example in FIG. 1 and FIG. 2, but instead the drain current is collected by a buried layer 205 in the substrate 200 and transferred by a sinker 207 to the surface 201 of the substrate 200. In this embodiment the substrate 200 may be exemplarily p-type doped and the sinker 207 and the buried layer 205 are heavily n$^+$-type doped. The n$^+$-sinker and the n$^+$-buried layer are formed in a lightly n-type doped n-well region 209. The n-well region 209 includes a lightly p-type doped body region 210 of the QVDMOS. Within the body region 210 there is a heavily n$^+$-type doped source region 212 formed. The channel region 214 of the transistor is covered by a gate electrode 218 with an intermediate gate oxide 216. The gate electrode 218 may be made of polysilicon or a metal. In this embodiment the QVDMOS includes exemplarily five stacked metallization layers 220*a-e*, which are separated and covered by six dielectric or inter layer dielectric (ILD) layers 225*a-f*. The first ILD layer 225*a* may isolate the gate electrode among others against the first metal layer 220*a*, which is connected to the source 212 and body 210 region of the QVDMOS. The first metallization layer is also the lowest metallization layer in the stack of layers. The second ILD layer 225*b* may be arranged between the source metal layer 220*a* and a second metal layer 220*b*, which is in contact with the n⁺-sinker and forms therefore the drain metallization layer. A third ILD layer 225*c* is arranged above the drain metallization layer 220*b* between a third metal layer 220*c*, which may be in contact to the gate electrode 218 (not illustrated in FIG. 3). A fourth dielectric layer 225*d* is arranged between the third 220*c* and the fourth 220*d* metal layer. The fourth metal 220*d* layer is covered by a further fifth ILD layer 225*e*. Finally a fifth metal layer 220*e* arranged above the fifth ILD layer 225*e* is covered by a sixth dielectric layer 225*f*, for example a boron phosphorus silicate glass (PBSG) layer or another dielectric layer. The fifth metallization layer is in this example the highest metallization layer of the stacked layers. As it is illustrated in FIG. 3 the fourth metallization layer 220*d*, that means the second metallization layer counting from top to bottom of the stacked layers, includes the above described holes 230*a-c*, filled with dielectric, e.g., silicon oxide. In FIG. 3 the third metallization layer 220*c* includes also holes 230*d,e* filled with dielectric. The holes 230*a-e*, are used as supporting structures for the superjacent layers and for the reduction of the continuous size of the respective metal layer. So the area of the metallization layer is reduced to smaller connected metallization layer portions 220*d′*,220*c′*. It should be mentioned, that the metal layer portions 220*d′* and 220*c′* within the same respective metallization layers 220*d*, 220*c* are still electrically connected. As described above the holes lead to an improved temperature cycling reliability of the QVDMOS, caused by the mechanical support and an increased yield point of the small-sized metallization layer portions 220*c′*,220*d′*, compared to a continuous formed metal layer 220*c*, 220*d*. The holes 230*a-c* in the fourth metal layer 220*d* and the holes 230*d-e* of the third metal layer 220*c* are arranged in such a way, that they are not overlapping.

It should be noted that the described embodiment, for example the arrangement, the task and the number of layers and the layer and the number of layers including the holes may be different.

In another embodiment for example the holes in a metallization layer are just formed in a second metallization layer counting from top to bottom of stacked metallization layers. In other words only in the second highest metallization layer of the stack counting from top to bottom of the stack.

Furthermore, the conductivity type of the doping of the substrate can be reversed or changed along with the connections to the layers. Therefore, it is understood that variations and modifications of the described embodiments may be made without departing from the true spirit and scope of the invention.

Figure 4:
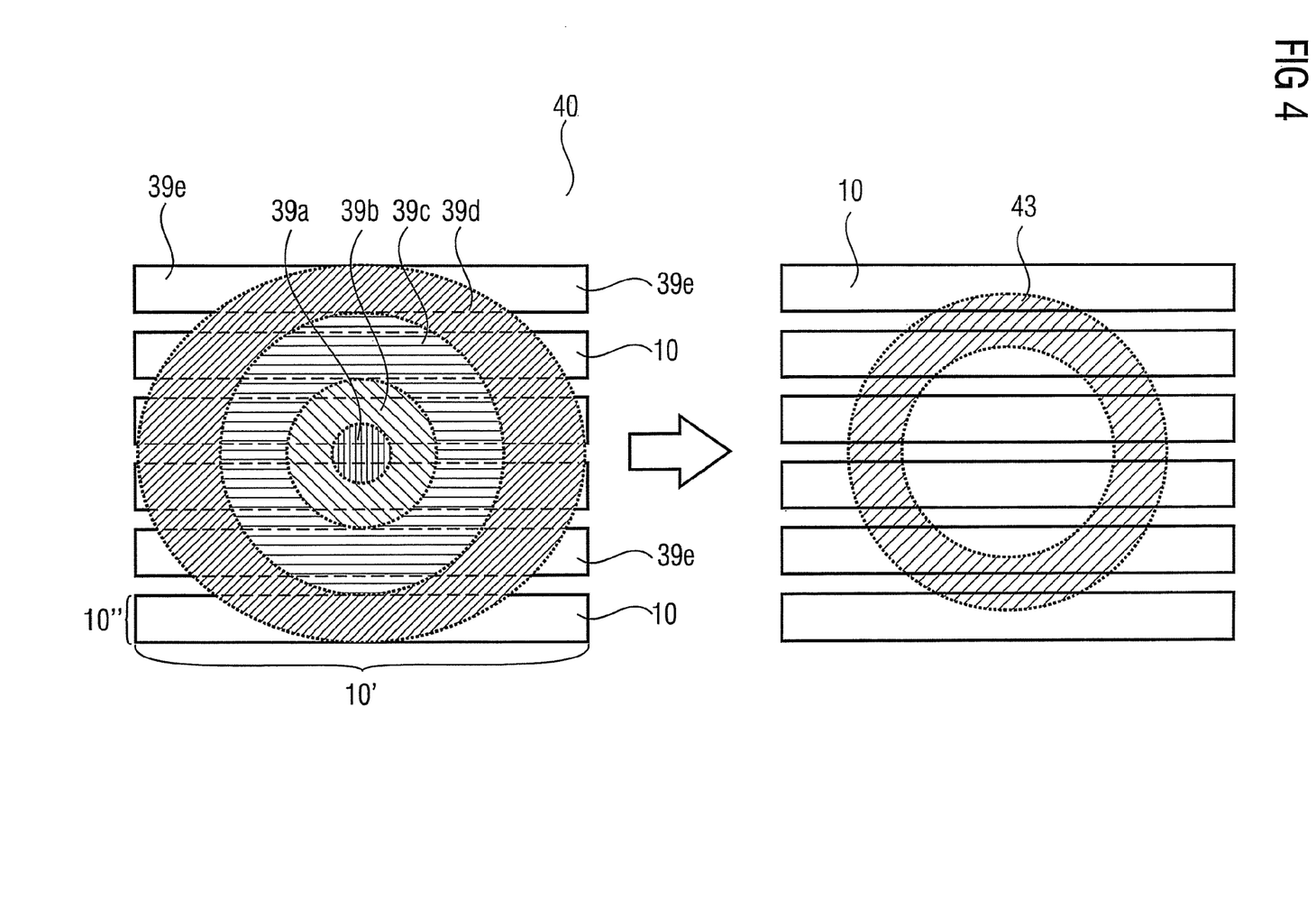
FIG. 4 illustrates the thermal-electric simulation of a DMOS transistor during switching an inductive load and areas of the resulting maximum temperature gradient in the metallization of the respective power device.

In FIG. 4, a schematic thermal simulation of a power device, illustrated from a top view, during the commutation of an inductive load is illustrated. The power device 40 may include a plurality of DMOS transistors with a respective active area including an electrical dissipation heating a plurality of metallization layer portions 10, which are arranged in parallel to each other. A side with the length L 10′ of the metallization layer portions 10 is larger than the respective side with the width W 10″. During a power down, a dissipation of a inductive energy in the power device can be observed. This can involve a strong increase of the temperature T in the power device and hence to a severe temperature increase of more than 150° C., for example. The temperature change can be occur cyclically. The center part 39*a* of the rectangular shaped power device includes the highest temperature T of about 330° C., whereas the edge regions 39*e* of the power device 40 include a temperatures T of approximately 220° C. The thermal simulation may reveal more or less concentric rings 39*a-d* having a certain temperature interval, for example the ring 39*b* may include a temperature of about 310° C., the ring 39*c* of approximately 290° C. and the ring 39*d* of approximately 270° C. By using the thermal simulation, which is part of a conventional design flow for power devices, the location of the maximum temperature gradient in the power device can be identified. As a result of the thermal simulation of the power device 40, the ring shaped region 43 can be identified as the region with the maximum temperature gradient of the power device 40 during a repetitive clamping. The heating of a power device may, for example, occur during a normal operation of the device, during an external heating or a heating due to turning off or on the power device.

After the identification of the maximum temperature gradient, the exact position of the at least one hole or the plurality of holes, which serve as a mechanical support for the power device metallization and superjacent ILD layer, will be determined based on this information. The exact position of the supporting holes filled with a dielectric depends on the size of the metallization layer portion. In general, metallization layer portions, conductor paths respectively, which are wider than 10 µm should be enforced by the hole-like supporting structures. This may also apply to conductor paths in the metal layer of a signal metallization of a power device. The hole-like supporting structures may consist of oxide stripes parallel arranged to the longer side L of the power device, wherein the oxide supporting structures may include a minimal structure size. The oxide stripes, the supporting holes respectively need not to be realized as continuous stripes, but can be interrupted in a ratio of 1:2. That means one part, of a structural interruption of the supporting structures can interrupt a supporting structure having two parts. In other words, the supporting structures are up to two times larger than a interruption of the supporting structure in the metallization layer. This is explained in more detail in connection with FIG. 5.

Figure 5:
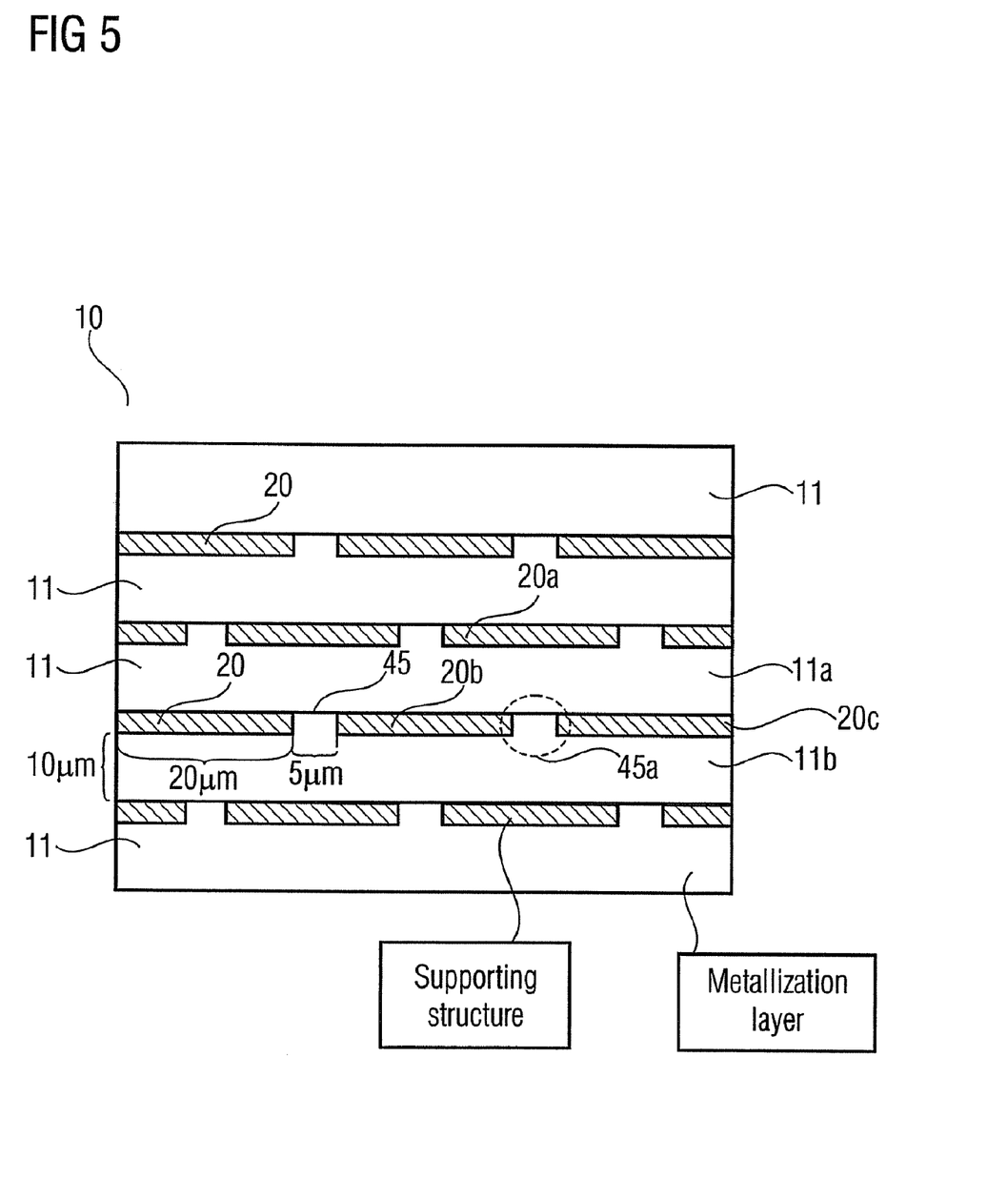
FIG. 5 illustrates the layout of a continuous metallization layer, which is interrupted by supporting oxide structures so that the continuous metal layer includes 10 μm wide conductor paths according to an embodiment.

FIG. 5 illustrates an embodiment of a metal layer portion 10, which is splitted by the oblong holes in conductive paths 11 with a maximum width of 10 µm. The holes can be formed as oblong holes 20, which need not to be connected to each other, but can be interrupted as it is illustrated in FIG. 5. In this embodiment of the invention, the ratio between interrupted parts 45 of the supporting structures and the supporting structures 20 is 1:4, that means the supporting structures 20 include a length of 20 µm and the interruption parts 45 include a length of 5 µm. The ratio between the supporting structures 20 and the follow on interruption of the supporting structures 45 may be increased up to a maximum ration of 1:2. The length of the supporting structures is at least twice as large as the length of the interruption 45 of the supporting structure 20.

Exemplarily the arrangement of the supporting structures to each other will be explained in the following. The supporting structures 20*a*-20*c* of neighboring conductive paths 11*a*-11*b* are staggered to each other. That means that the interruption 45*a* between the two supporting structures 20*b* and 20*c* is axially parallel and centric aligned to the supporting structure 20*a* of the conductive path 11*a*. The interruptions between parallel aligned supporting structures should not be located directly across from each other. The interruption of neighboring conductive paths are staggered relative to each other.

In general, the supporting holes may cover collectively more than 1%, but less than 50% of the area of the metallization layer portion. Moreover, the minimum distance between neighboring holes may be more than 1%, but less than 50% of the length or the diameter of a supporting structure. It should be noted that the at least one hole can have, in principle, any shape which might fulfill the task to support mechanically the metallization layer portion during a repetitive heating process. That means the supporting structure could have for example a circle shaped, a ring shaped, a rectangle shaped, a oblong hole shaped, or a quadratic shaped structure or others as well.

By introducing the supporting structures having a dielectric, the ohmic resistance of the respective metallization layer portion may be increased. The number of holes and their location may be chosen so that an ohmic resistance of the metallization layer portion increases by more than 0.1%, but less than 0.5%.

Figure 6:
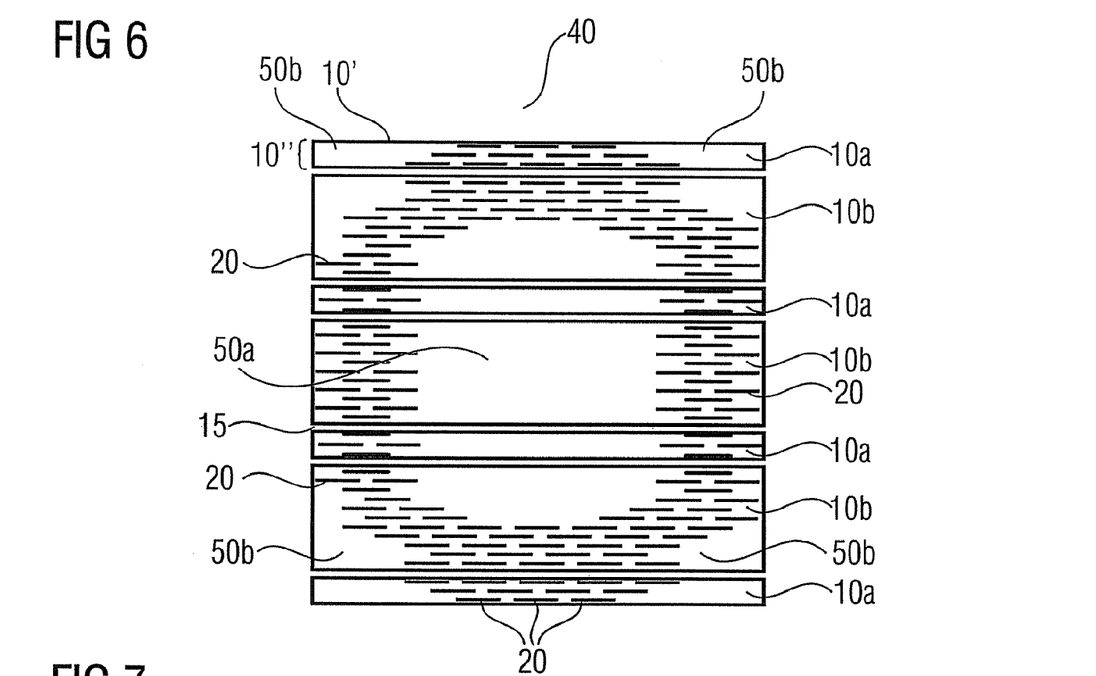
FIG. 6 illustrates the top view of a metal layer for a power device having a plurality of metallization layer portions with supporting structures, arranged in a ring-shaped way in the metallization layer portions according to an embodiment.
Figure 7:
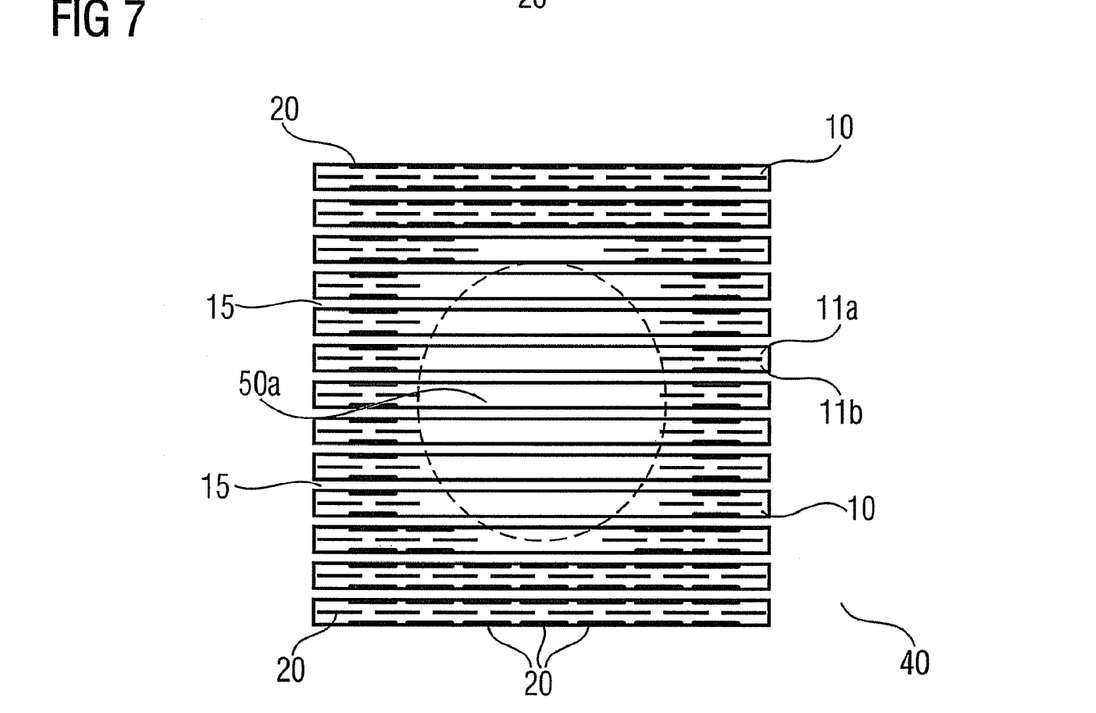
FIG. 7 illustrates the top view of a metallization layer having a plurality of metallization layer portions with oblong holes parallel oriented to the oblong metallization layer portions, wherein a circular shaped center part of the metallization layer does not include oblong hole supporting structures according to another embodiment.

FIG. 6 illustrates another embodiment. In this embodiment, the top view of a plurality of parallel arranged rectangular metallization layer portions forming a quadratic metal layer is illustrated from a top view perspective. The power device 40 may include metallization layer portions with a different width, for example, with a width of 30 μm 10a and a width of 120 μm 10b. The metallization layer portions may be arranged so with respect to an active area of the power device 40 that the dissipation characteristic of the active area results in heating the metallization layer portions 10a and 10b. It should be mentioned that the metallization layer portions need not to be connected electrically with the active area of the power device, but at least thermally. That means that all metallization layer portions, which are in thermal contact to an active area of the power device can include the supporting holes. The metallization layer portions 10a and 10b in FIG. 6 may be separated by a dielectric 15.

As already explained in context to FIG. 4, the design rules for arranging the supporting oblong holes in the metallization layer portion may be based on the result of a thermal simulation. By the thermal simulation, the regions of the power device 40 with the maximum temperature gradient, that means, in a mathematical expression grad(T)=maximal, may be identified and, based on this information, the exact position of the supporting holes 20 may be determined for a respective mask for each of the metallization layer portions 10a and 10b. In the embodiment of FIG. 6, the maximum temperature gradient of the power device 40 may form a circle on top of all metallization layer portions 10a and 10b and this is why the respective oblong supporting holes are arranged in a ring shaped form on the plurality of metallization layer portions 10a and 10b.

As described above, the oblong supporting holes 20 are parallel oriented to the longer side 10' of the respective metallization layer portions 10a and 10b, wherein the oblong supporting holes 20 are staggered again to each other.

In mechanical research it has been shown that the parallel orientation of the oblong supporting holes, which might be filled with oxide, might not be so critical, because a deformation of the metallization layer portions caused by a repetitive clamping includes a concentric deformation, which is independent of the relative orientation to the supporting holes structures.

As a design rule, the parallel orientation of the supporting hole structures to the longer side 10' of the metallization layer portion may be applied in order to avoid a negative influence of the supporting hole structures to the electron migration reliability of the metallization layer portions.

The supporting structures 20 may be, in general, formed within a sub-area of the metallization layer portion, having an extension up to 300 μm to a line defined by the maximum temperature gradient (grad(T)=maximal) on the respective metallization layer portion. That means also the power device 40 may include metallization layer portions 10a, 10b with regions 50a,b which do not include supporting hole structures 20. This may count, for example, for the inner part 50a, including the regions of the power device with the maximum temperature, whereas the regions 50b may include just moderate temperatures. In this embodiment the supporting structures are just formed in sub-areas of the metallization layer which are including the maximum temperature gradient during a temperature change triggered by current pulses or a repetitive clamping or a power cycling. The remaining sub-areas of the metallization do not reveal any supporting structures, holes respectively.

A metallization layer layout with the above explained design rules for the supporting structures and a respective power device including a metallization layer performed with such a kind of mask is in contrast to conventional and used design rules for a power DMOS. So far, the source and drain regions of the power DMOS device have been connected to a metallization layer including a surface coverage as large as possible in order to minimize the turn-on resistance of the power device. Normally, this design rule for the metallization layer portion regarding the turn-on resistance for power DMOS amplifiers are not relevant for applications, which include repetitive clamping, since the size of the DMOS transistors is no more determined by the turn-on resistance, but rather by the thermal requirements. Therefore, the layout rules for the metallization layers of power DMOS transistors postulating a maximum surface coverage in order to obtain the minimum turn-on resistance are secondary. In other words, the size of the power DMOS transistors is rather determined by the thermal behavior and requirements on the power device than by the respective turn-on resistance.

That means it is feasible to reduce the size of the power DMOS transistors by introducing the supporting holes in the respective metallization layer portions in order to improve the mechanical stability during a repetitive clamping cycle of the power device.

A metallization layer portion, which is having additional supporting structures at positions with the maximum temperature gradient can be realized with a plurality of layouts. Therefore, in FIG. 7 another embodiment of the invention is illustrated exemplarily. The top view picture of a lateral DMOS 40 depicts again a plurality of rectangular metallization layer portions 10, which are arranged parallel to each other and which are separated by a dielectric 15. In comparison to metallization layer portions of a vertical DMOS, which is illustrated in FIG. 5 the lateral DMOS includes more narrow metallization layer portions 10. That means, there are less conductive paths 11a,b in a metallization layer portion 10 and hence less supporting structures 20 per metallization layer portions 10 are necessary. But the mechanical robustness during a repetitive heating or power cycling is also in the case of the lateral DMOS transistor increased by the supporting structures 20. The metallization layer portions 10 in FIG. 76 may include a width of approximately 20 μm. In this embodiment, only the inner part 50a of the lateral DMOS 40 does not include any supporting structures 20.

It should be noted, that the top view of the power device and the respective metallization layer portions can include any shape or outline and need not to be rectangular or quadratic.

Figure 8:
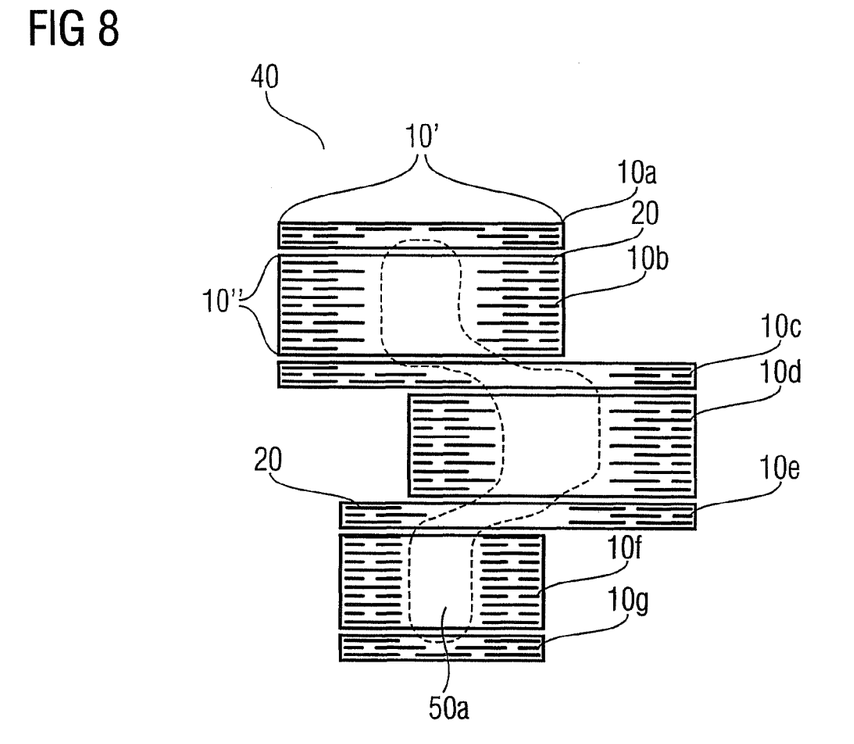
FIG. 8 illustrates the top view of a metallization layer with a more complex geometry for a vertical or a lateral DMOS transistor, having oblong hole shaped supporting structures according to another embodiment.

Frequently, power DMOS transistors are integrated into the layout of a special product and, therefore, the shape of the power DMOS device within a larger chip may include a more complex outline. This is illustrated exemplarily in FIG. 8. A vertical or lateral power DMOS transistor, which is integrated in the layout of a certain product, can include source regions with a different length. Therefore also the length of the metallization layer portions, which may be arranged above the source stripes of the DMOS transistors may vary. Accordingly, the metallization layer portions 10a-10g include partly a different length L 10' and may be additional lateral shifted to each other depending to the customized product design. For such a complex geometry the maximum temperature gradient, which can be identified again by a thermo-electric simulation of the power device may run along a more complicated line. This more complicated line of the maximum temperature gradient of the power device 40 is reflected in the respective more complicated arrangement of the dedicated oblong supporting holes 20. On each metallization layer portion 10a-10g, the oblong supporting holes are formed in a sub-area including the respective maximum temperature gradient of the respective metallization layer portion. As illustrated in FIG. 8, an inner part 50a of the power device 40 need not include again an oblong supporting hole 20. This inner part of the power device 40 may include the maximum temperature of the power device 40 during a power cycling heating according to a thermal simulation of the power device. It should be noted, that the oblong supporting holes 20 are staggered to each other again. By using the oblong supporting structures in the metallization layer portions of the power device, the mechanical robustness during a temperature cycling of the metallization of the DMOS can be improved even for power devices with a more complex geometry.

Figure 9:
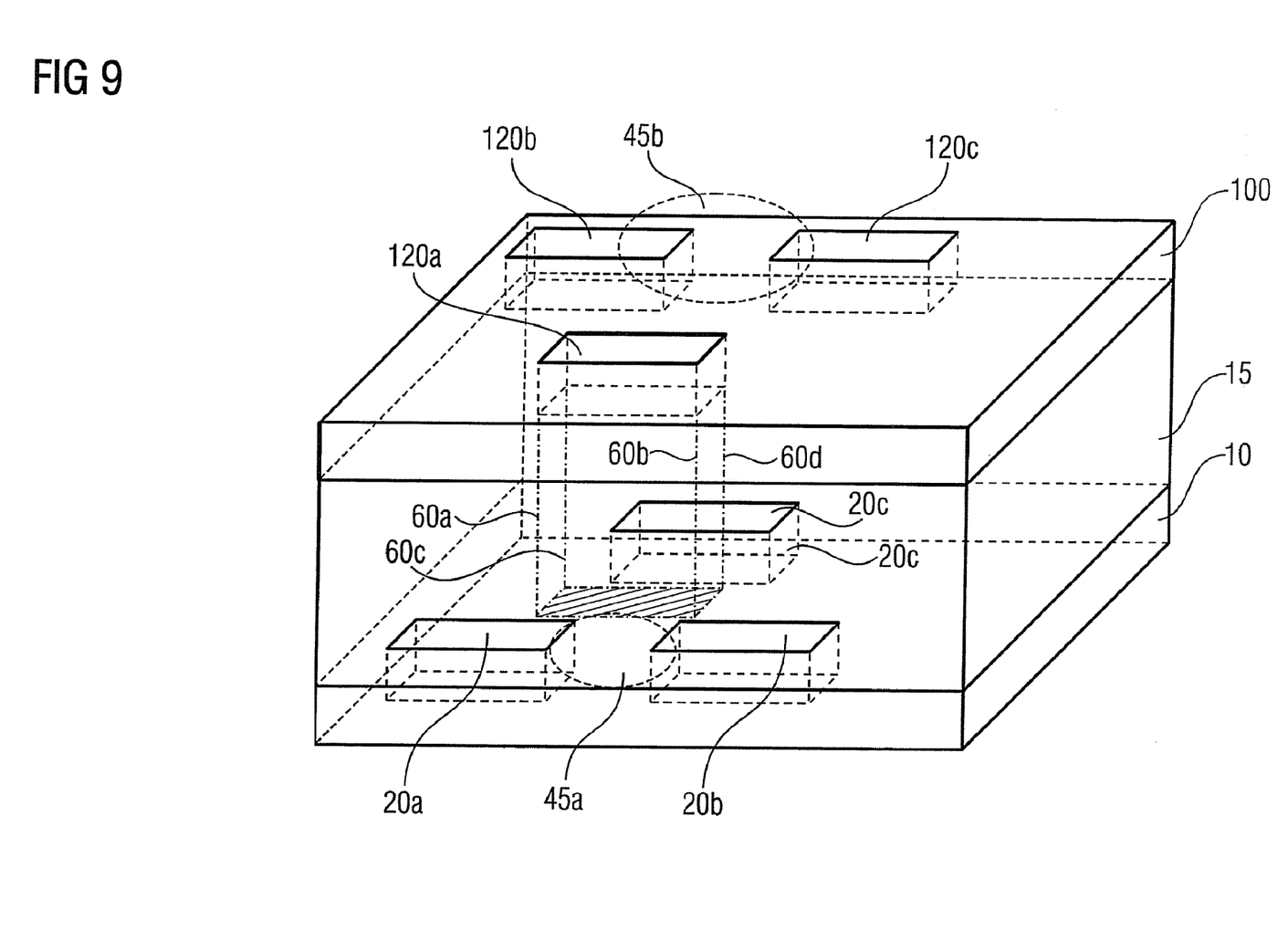
FIG. 9 illustrates a schematic lateral view of the arrangement of supporting structures to each other, formed in two different metal layers according to another embodiment.

In FIG. 9 another embodiment is illustrated. A power device includes additional to a first metal layer with metallization layer portions 10, another metal layer with metallization layer portion 100 separated by an intermediate layer 15. Both metallization layers portions 10 and 100 include supporting hole structures 20a-20c and 120a-120c, fully extending through the respective metallization layers 10, 100 and having a dielectric. The supporting structures 20a-20c and 120a-120c serve to support mechanically the power device against a viscoplastic deformation during a repetitive clamping cycle of a power device and to reduce the connected area of the metallization layer arranged so with respect to the metallization layer portions that a dissipation characteristic of an active area of the power device results in heating the metallization layer portions. The design rules of the supporting hole structures among each other and within the same metallization layer 100 or 10 are described above. But the supporting hole structures of one metal layer should be also staggered with respect to the supporting hole structures of the other metal layer. This is illustrated exemplarily in FIG. 9. The supporting hole structures 20a-20c of a metallization layer portion 10 are staggered so that an interruption 45 a of the supporting hole structures 20a and 20b is axial parallel and centric arranged across the supporting structure 20c. The same is valid for the interruption 45b of the supporting structures 120b and 120c with reference to the supporting structures 120a of the metallization layer 100. The supporting hole structures of one metal layer, the first metal layer for example, are arranged with reference to the supporting structures of the other metal layer, the second metal layer for example, so that they are staggered to each other. That means there may no overlap of the layout of the supporting structures in one metallization layer with the layout of the supporting structures of a neighboring metallization layer, including supporting structures as well.

In the embodiment illustrated in FIG. 9, the supporting structure 120a is arranged in the metallization layer 100 in such a way that a projection of the layout of the supporting structure 120a to the metallization layer 10 does not overlap with any supporting structures 20a, 20b of the metallization layer 10. Rather, the supporting structure 120a is arranged exemplarily so that the interruption 45a between the supporting holes 20a and 20b is centric, axial parallel to the projection of the supporting structure 120a on the metallization layer 10. The layout projection 60a-60d of the supporting hole 120a may only touch the supporting structures 20a and 20b of the metallization layer 10. That means, the projection may form-locking touching the supporting structures 20a-20b.

Figure 10:
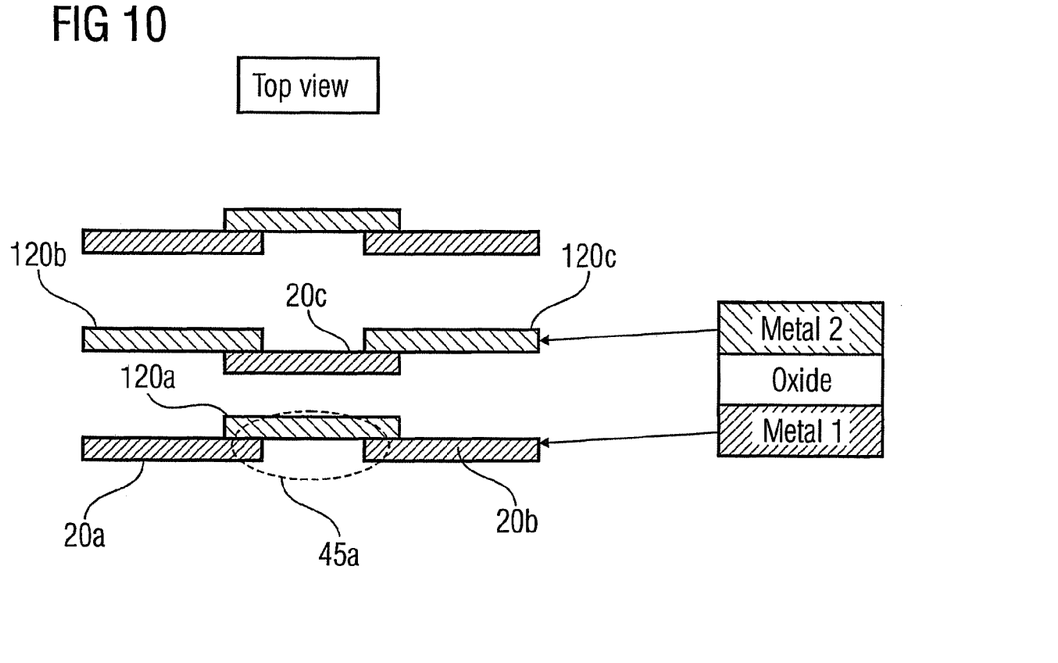
FIG. 10 illustrates the top view of the arrangement of supporting structures to each other, formed in two different metal layers according to an embodiment.

For a better understanding the top view of the two metallization layers and the respective oblong holes, supporting structures respectively are illustrated in FIG. 109. As described above, the supporting hole structures 20a-20c are staggered among each other on the respective metallization layer portion 10. The same is valid for the oblong supporting hole structures 120a-120d in the second metallization layer portion 100. In relation to the oblong supporting hole structures of the other metallization layer, they are also staggered to each other. That means, for example, the supporting hole structure 120a is from a top view point of view, axial parallel and centric arranged to an interruption 45a between two supporting structures 20a and 20b of the metallization layer 10. That means the projection of the layout of the supporting structure 120a to the metallization layer 10 includes no overlap to the layout of the supporting structures 20a and 20b, but may be form-locking arranged so that they touch each other along one side of the oblong supporting hole structure. The remaining supporting structures are arranged following the same layout design rules as described.

The two metallization layers 10 and 100 may be separated by an intermetal dielectric, for example, as it is illustrated in FIG. 10, with an oxide layer.

The oblong supporting holes may, for example, include a width between 100 nm and 1 μm, for example, 200 nm. Furthermore, the length of the oblong hole supporting holes may be, for example, between 5 μm and 50 μm, for example, 20 μm.

The active area of the power device may be formed by an active area of a transistor and the metallization layer portion may be connected electrically to a source, a gate or a drain region of the transistor.

The active area of the power device may be formed by an active area of an insulated gate bipolar transistor (IGBT) or by a bi-polar power junction transistor (BJT).

That means, in general in case there are a plurality of metallization layers arranged on top of each other, spaced by a dielectric layer, the supporting hole structures are realized in such a way that they are shifted in a vertical direction relative to each other. This may be done in order to increase the mechanical stability of the power device in the respective metallization layer and inter metal dielectric layers in case of a heating or repetitive clamping of the power device.

Figure 11:
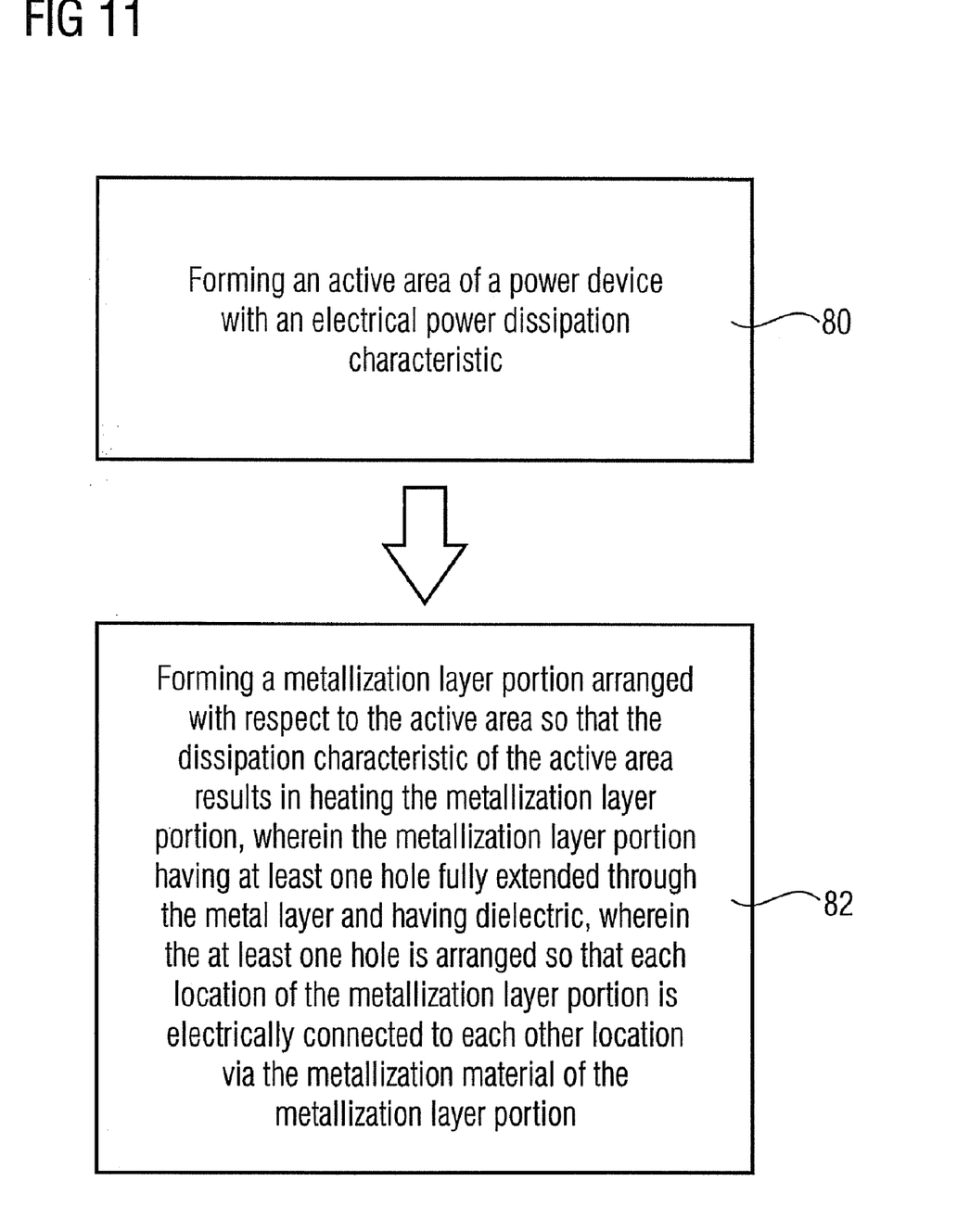
FIG. 11 illustrates a flow chart one embodiment of a method for producing a power device.

In the flow chart of FIG. 11, the method of manufacturing the power device is illustrated. The method including forming 80 an active area of a power device with an electrical power dissipation characteristic; and forming 82 a metallization layer portion arranged with respect to the active area, so that the dissipation characteristic of the active area results in heating the metallization layer portion; wherein the metallization layer portion having at least one hole fully extending through the metal layer and having dielectric, wherein the at least one hole is arranged so that each location of the metallization layer portion is electrically connected to each other location via the metallization material of the metallization layer portion.

The method of forming a metallization layer portion having at least one hole may be performed using an additional photolithography process, that means among others an additional mask process in order to form the at least one hole in the metallization layer portion. It should be noted that there need not be an additional mask process necessary in order to form the at least one hole in the metallization layer. But it is also feasible that after depositing a photo resist on the metallization layer portion and performing a respective mask process the metal in the at least one hole of the metallization layer is removed by etching. But it is also feasible, that no additional mask process is needed and the at least one hole is filled with a dielectric. For example, an oxide layer can be deposited in the at least one hole, for example, by using a chemical vapor deposition (CVD). The at least one hole may be filled with other dielectrics, for example, nitride or organic materials used in the semiconductor processing. The method of manufacturing a power device may further include the forming of additional metallization layers and dielectric layers, in order to isolate the metallization layer from each other. It is understood that it is necessary to perform the respective photolithography processes, etching processes and depositing processes in order to form the additional layers of the power device. This can be done in a conventional way used in semiconductor processing.

The forming of an active area of a power device with an electrical dissipation characteristic may be performed such that a drain region, a source region, a channel region and a gate region separated from the channel region by a gate dielectric is formed. The forming of an active area of a power device may be performed in such a way that a lateral DMOS, a QVDMOS, a vertical DMOS, for example a trench DMOS, is formed. It is also feasible that the formation of an active area of a power device is performed such that an insulated gate bipolar transistor (IGBT) or a bipolar transistor, for example a BJT is formed. These power devices may be formed in a conventional way, wherein the formation of at least one metallization layer portion with the above at least one hole—the supporting hole structures—is performed. The at least one hole may be formed as oblong holes parallel oriented to a longer side L of a metallization layer portion, wherein the metallization layer portion may, for example, include at least a width W of more than 10 µm. The forming of a metallization layer including the at least one hole may be performed so that the supporting structures are formed in one or more sub-areas having a maximum temperature gradient, that means in a mathematical expression grad(T)=maximal.

The forming of a metallization layer portion with the supporting structures including a dielectric may be performed so that a region of the metallization layer portion having the maximum temperature during a function run of the power device does not include any supporting structures. The forming of a metallization layer with the supporting structures may be performed so that the supporting structures are just arranged in a region within 300 µm of a line defined by the maximum temperature gradient of the respective metallization layer portion. The remaining area of the metallization layer portions does not include any supporting hole structures. In another embodiment it need not include any supporting holes but could.

The metallization material used for the formation of the metallization layer portions can be conventional metals used in the semiconductor processing, for example, aluminum or copper.

Figure 12:
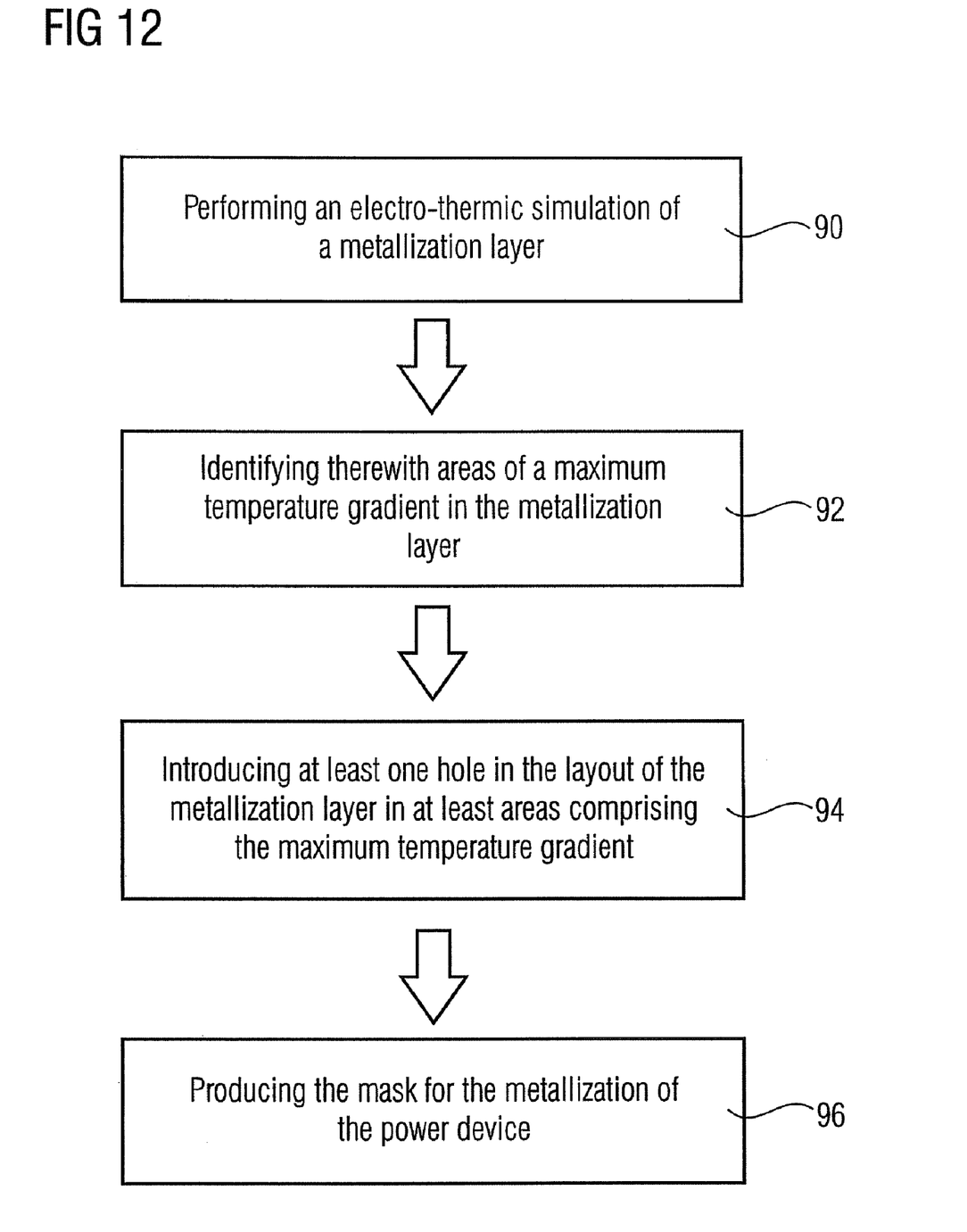
FIG. 12 illustrates a flow chart of one embodiment of a method of manufacturing a mask for a metallization layer of a power device.

In FIG. 12, the method of manufacturing a mask for a metallization of a power device is illustrated. The method includes the performing of an electro-thermic simulation 90 of the temperature distribution of an usual metallization of the power device, arranged with respect to an active area of the power device, having an electrical power dissipation characteristic so that the dissipation characteristic of the active area results in heating the metallization layer portion. Therewith areas of a maximum temperature gradient in the metallization layer portions are identified 92 and at least one hole defining a supporting structure for the power device is introduced 94 in the layout of the metallization layer portion. Afterwards, the mask can be produced 96 in a conventional way.

It should be noted that the layout of the metallization layer portion mask may include a plurality of holes for supporting structures, which are arranged staggered to each other. For example, the layout of the holes, the supporting structures, respectively, may be oblong holes, circles, or rectangular shaped. The layout of the supporting structures, for example, may be staggered in such a way that it includes interruptions between two supporting structures, wherein those interruptions are located centric to a parallel shifted further supporting structure. The performing of an electro-thermic simulation, a thermo-electric or a thermal simulation respectively, may be performed in a conventional way, as well as the production of the actual mask for the metallization of the power device.

By introducing the at least one hole—the supporting structure—the viscoplastic deformation of a metallization layer, a metallization layer portion respective, caused by a heating, particularly, by a repetitively clamping cycle, can be reduced. Therefore, the lifetime of a power device with such a described metallization can be prolonged and the reliability improved. The reduction of the viscoplastic or plastic deformation can be achieved by the supporting structures at regions having the maximum temperature gradient of the power device. In order to achieve this, design rules for metallization, for example, with aluminum, can be summarized as follows: At positions of a power device, which are having the maximum temperature gradient and, therefore, the maximum mechanical forces, no large and continuous metal layers should be realized. The reason is that in large metal layers, the mechanical deformations can be particularly distinct. In order to prevent this, metallization layers with a length and width of approximately more than 10 µm should include additional supporting structures. The supporting structures may be filled with dielectric. Wherein the dielectric may include a reduced viscoplastic deformation compared to the metal used for the metallization layer portion during a heating.

While the foregoing has been particularly illustrated and described with reference to particular embodiments thereof, it will be understood by those skilled in the art that various other changes in the form and details may be made without departing from the spirit and scope thereof. It is to be understood that various changes may be made in adapting to different embodiments without departing from the broader concepts disclosed herein and comprehend by the claims that follow.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A power device comprising:
an active area having an electrical power dissipation characteristic;
a metallization layer portion arranged configured such that the dissipation characteristic of the active area results in heating the metallization layer portion, the metallization layer portion being formed as a connected region, wherein the metallization layer portion having at least one hole, fully extending through the metal layer and having a dielectric; and
wherein the at least one hole is arranged so that each location of the metallization layer portion is connected electrically to each other location via the metallization material of the metallization layer portion.

2. The device of claim 1, wherein the at least one hole is formed in one or more sub-areas of the metallization layer portion, comprising a maximum temperature gradient, which results upon a heating of the metallization layer portion by the dissipation characteristic of the active area of the power device.

3. The device of claim 2, wherein the one or more sub-areas have an extension of approximately up to 300 μm, to a line defined by the maximum temperature gradient.

4. The device of claim 2, wherein other sub-areas do not comprise at least one hole.

5. The device of claim 1, wherein the power device comprises several stacked metallization layers separated by dielectric layers and wherein only a metallization layer portion of a second highest metallization layer having at least one hole.

6. The device of claim 5, wherein the at least one hole is only formed in one or more sub-areas of the metallization layer portion, comprising a maximum temperature gradient, which results upon a heating of the metallization layer portion by the dissipation characteristic of the active area of the power device.

7. The device of claim 1, wherein the power device comprises several stacked metallization layers separated by dielectric layers and wherein the highest and the lowest metallization layer does not comprise a metallization layer portion with at least one hole.

8. The device of claim 1, wherein the at least one hole comprises a dielectric with a less viscoplastic deformation characteristic than the metallization layer portion upon heating.

9. The device of claim 1, wherein the power device comprises at least one further layer on top of the metallization layer portion, supported mechanically by the metallization layer portion and the dielectric and the at least one hole.

10. The device of claim 1, comprising a metallization layer portion in a second metallization layer above or beneath the metallization layer portion in a first metallization layer, with an intermediate dielectric layer and wherein the at least one holes are arranged in such a way to each other that the layout of the holes is staggered.

11. The device of claim 1, wherein all metallization material bordering the at least one hole is electrically connected.

12. A power device comprising:
an active area having an electrical power dissipation characteristic;
a metallization layer portion arranged configured such that the dissipation characteristic of the active area results in heating the metallization layer portion, the metallization layer portion being formed as a connected region, wherein the metallization layer portion having at least one hole, fully extending through the metal layer and having a dielectric; and
wherein the at least one hole is arranged so that each location of the metallization layer portion is connected electrically to each other location via the metallization material of the metallization layer portion,
wherein the metallization layer portion comprises a length L larger than a width W and wherein the at least one hole is formed as an oblong hole oriented parallel to the side with the length L of the metallization layer portion;
wherein the active area is connected with a metallization layer portion electrically;
wherein the metallization layer portion does not comprise an at least one hole in a region comprising a maximum temperature upon heating;
wherein the dielectric comprises oxide; and
wherein the active area is formed by an active area of a transistor and the metallization layer portion is at least connected thermally to a source or drain region of the transistor.

13. A power device comprising:
an active area having an electrical power dissipation characteristic;
a metallization layer portion arranged configured such that the dissipation characteristic of the active area results in heating the metallization layer portion, the metallization layer portion being formed as a connected region, wherein the metallization layer portion having at least one hole, fully extending through the metal layer and having a dielectric; and
wherein the at least one hole is arranged so that each location of the metallization layer portion is connected electrically to each other location via the metallization material of the metallization layer portion,
wherein the power device comprises a plurality of rectangular shaped parallel arranged metallization layer portions, wherein each of the metallization layer portions comprises a plurality of holes formed as oblong holes parallel oriented to a longer side of the rectangular shaped metallization layer portions and wherein the plurality of oblong holes are arranged in a ring-like shape in the plurality of rectangular metallization layer portions defined by the maximum temperature gradient of each of the rectangular shaped metallization layer portions.

14. A power device including a metal-oxide-semiconductor field-effect-transistor structure comprising:
a plurality of power MOSFET;
a plurality of active areas formed by the power MOSFET having an electrical power dissipation characteristic; and
a plurality of metallization layer portions arranged so with respect to the corresponding active areas that the dissipation characteristic of the active area results in heating the metallization layer portions, each of the metallization layer portions being formed as a connected region, wherein each of the metallization layer portions having at least one hole, fully extending through the metal layer and having dielectric, wherein the at least one hole is arranged so that each location of the metallization layer portion is connected electrically to each other location via the metallization material of the metal layer portion.

15. The device of claim 14, wherein the power MOSFET are trench DMOS in a substrate comprising a silicon oxide trench structure, filled at least partially with polysilicon formed as a gate electrode with a neighboring gate oxide, formed by the silicon oxide of the trench structure and a mesa area between two trench structures doped to form source regions adjacent to the gate oxide and a drain region formed in a doped substrate region, wherein the metallization layer portions are connected to the corresponding source regions of the trench DMOS.

16. The device of claim 14, wherein the at least one hole in each of the plurality of metallization layer portions comprises a dielectric material with a less viscoplastic deformation characteristic than the metallization layer portion upon a heating; and wherein the dielectric material comprises oxide.

17. The device of claim 14, wherein the plurality of power MOSFET comprise at least one further layer on top of the metallization layer portion, supported mechanically by the metallization layer portion and the dielectric in the at least one hole;

wherein the plurality of metallization layer portions comprise a length L larger than a width W; and wherein the at least one hole is formed as an oblong hole parallel oriented to the side with the length L of the metallization layer portion;

wherein the plurality of metallization layer portions having a at least one hole at an area comprising the maximum temperature gradient of a respective metallization layer portion; and wherein the plurality of metallization layer portions are connected electrically to the respective source regions of the trench MOSFET.

18. The device of claim 14, wherein all metallization material bordering the at least one hole is electrically connected.

* * * * *